United States Patent [19]
Comizzoli et al.

[11] Patent Number: 5,851,849
[45] Date of Patent: Dec. 22, 1998

[54] PROCESS FOR PASSIVATING SEMICONDUCTOR LASER STRUCTURES WITH SEVERE STEPS IN SURFACE TOPOGRAPHY

[75] Inventors: Robert Benedict Comizzoli, Belle Mead, N.J.; Mindaugas Fernand Dautartas, Alburtis; John William Osenbach, Kutztown, both of Pa.

[73] Assignee: Lucent Technologies Inc., Murray Hill, N.J.

[21] Appl. No.: 848,736

[22] Filed: May 22, 1997

[51] Int. Cl.$^6$ ........................................................ H01S 3/19
[52] U.S. Cl. .................................. 438/38; 438/26; 372/49
[58] Field of Search ........................... 438/38, 26; 117/84, 117/104; 427/255; 372/49

[56] References Cited

U.S. PATENT DOCUMENTS 4,058,430  11/1977  Suntola et al. ........................... 427/255
5,440,575  8/1995  Chand et al. ............................. 372/49

OTHER PUBLICATIONS

S. Wolf, "Silicon Processing for the VLSI Era", Lattice Press, p. 260 (no month given), 1990.

*Primary Examiner*—Charles Bowers
*Assistant Examiner*—Keith Christianson

[57] ABSTRACT

The specification describes a process for passivating semiconductor laser structures with severe steps in the surface topography. The technique involves atomic layer deposition to produce the passivating layer which has exceptional coverage and uniformity, even in the case of trench features with trench aspect ratios as large as 5. In addition, the passivation produced by this process has excellent environmental stability, and affords protection against air born contaminant induced degradation.

17 Claims, 6 Drawing Sheets

PROCESS FOR PASSIVATING SEMICONDUCTOR LASER STRUCTURES WITH SEVERE STEPS IN SURFACE TOPOGRAPHY

FIELD OF THE INVENTION

This invention relates to techniques for passivating laser devices.

BACKGROUND OF THE INVENTION

Semiconductor lasers rely on a reflective cavity which is typically formed by mirrors on the ends of a semiconductor crystal. In the usual structure one mirror has high reflectivity (HR), typically >70%, and the other is of lower reflectivity, typically <30%, (LR). For high performance DFB lasers, the low reflectivity mirror has a reflectivity of <1%. In these cases, as well as pump lasers, the performance of the laser is in large part controlled by the reflectivity of each mirror. As such, it is extremely important to control the optical thickness (i.e. refractive index and physical thickness) of the mirror coating. In high performance lasers the mirrors perform the additional function of passivating the surfaces of the semiconductor device. The surfaces of the laser device that are exposed to high light flux, typically >1 $MW/cm^2$, are susceptible to degradation which has become a serious problem in producing devices with the extended lifetimes required in, e.g., many communications applications. Facet degradation includes both catastrophic optical damage (COD) caused by intense optical flux and gradual erosion due to optically accelerated facet oxidation. The main cause of COD is local heating due to optical absorption and non-radiative recombination of optically generated carriers at the facets.

Problems of facet degradation have confronted laser device designers for years. Typically they become more critical as the device complexity and performance demands increase. The semiconductor materials used in advanced lightwave device technology are typically multilayer semiconductor crystals based on compounds of Ga, Al, and In with As and P. The device structures have a variety of forms with both edge emitting and surface emitting configurations. The following description deals primarily with edge emitting structures but it should be evident to those skilled in the art that the principles described apply to other laser structures as well.

High performance edge emitting semiconductor lasers typically have facets (mirrors) that are produced by mechanically cleaving a semiconductor crystal. A typical semiconductor crystal contains thousands of individual lasers. Although mechanical cleaving produces a near perfect facet, the newly exposed semiconductor surface begins to degrade instantly after cleavage, due to contaminants in the cleaving tool and exposure to air. This degradation remains as the primary failure initiator for GaAs based lasers.

Recognition of this degradation mechanism stimulated several reported approaches to overcome facet degradation. Among them are: (i) impurity induced lattice disordering (IILD) at the facet that increases the bandgap and thus reduces the optical absorption and facet heating (see W.X. Zou et al. IEEE Photon. Technol. Lett 3,400 (1991); (ii) growth of non-absorbing mirrors (NAM) on the laser facets (see H. Naito et al. J. Appl. Phys. 68, 4420, 1990) and M. Matsumoto et al. Jpn J. Appl. Phys. 32, L665 (1993); (iii) facet treatment by sulfur or sulfur-based compounds (see S. Kamiyame et al. Appl. Phys. Lett. 58, 2595 (1991) and H. Kawanishi et al., Proceedings of the SPIE Symposium on Laser Diode Technology and Applications II, Vol. 1219, 309 (1990); and (iv) cleaning or forming laser facets in high vacuum followed in situ by suitable passivation and LR/HR coating (see M. Gasser and E. E. Latta, U.S. Pat. No. 5,063,173 issued Nov. 5, 1991.

For hermetically sealed InP based edge emitting lasers, the interfacial oxidation in normal room ambient is not of much concern for low power devices (<100 mW). However, it is of concern for such devices when operated in non-hermetic packages. In this case, the laser can be exposed to high humidity and high temperatures during operation. This exposure can lead to laser degradation via oxidation/reduction reactions that ultimately lead to failure. GaAs based lasers could also be susceptible to such oxidation/reduction degradation if operated in moist environments. Thus in virtually all cases the performance of passivating coatings on laser devices is critical.

The passivation facet coating should be nonabsorbing, and should not react with the mirror facets in such a way as to cause degradation. Importantly, it should act as an effective barrier for diffusion of impurities from other materials in the laser package and, for non-hermetic packaged lasers, the environmental ambient in which the device is deployed. A wide variety of coating materials have been tried, with mixed success, for laser facet passivation. Some of these materials, e.g. Si, Ge, and ZnSe, are deposited in an oxygen free environment. Other materials that have been used successfully are $Ta_2O_5, Al_2O_3$, ZnSe, and yttrium stabilized zirconia (YSZ).

For non-hermetically packaged lasers, molecular beam deposited SiO has been shown to provide adequate mirror reflectivity while maintaining long term laser reliability (See U.S. Pat. No. 5,440,575 to N. Chand et al."Article Comprising a Semiconductor Laser With Stable Facet Coating"). To date we know of no other inorganic mirror coatings that have demonstrated reliability in non-hermetic packages.

The coating techniques used are evaporation and sputtering for oxygen free materials, and evaporation, reactive sputtering and CVD for oxides. CVD techniques are generally preferred because of thickness uniformity and conformal coating. The latter attribute is especially important in laser structures that have significant step geometries to cover. While in theory CVD thin film processes can yield good step coverage and thickness uniformity, in practice this is only the case when films are deposited at conditions where sufficient energy is available for redistribution of the depositing species. Such energy is usually supplied by increasing the growth temperature. In addition, some state of the art laser structures have complex device topography, where fluid flow constraints lead to CVD step coverage and film thickness uniformity that is less than desired. In particular, when device features have aspect ratios greater than about 3 (depth to width) or have surface features of any depth that are re-entrant, the step coverage obtainable by CVD, or other thin film processes conventionally used, is not uniform. This problem is further exacerbated due to the temperature limitations and corresponding process limitations placed on the laser at this point in its manufacture.

As used herein the term step coverage refers to the ability of the coating technique to produce a film that covers all portions of a given topological feature. The term thickness non-uniformity is used where some degree of coverage of all of the feature is obtained but the thickness of that coverage is not uniform. For optical devices, such as lasers, not only is the physical thickness and its uniformity important, but also the refractive index and its uniformity is important. As a result, for optical devices we prefer to deal with the optical thickness step coverage. Step coverage is frequently expressed in percent of the maximum, i.e. meaning that the thickness of the subject layer at some location, typically the thinnest portion of the layer, is x percent of the thickness at the thickest portion. Processes that perform well in the context of step coverage, i.e. processes that produce highly conformal films, usually have 70–80% coverage on the surface features.

In many device applications, substantial variations in thickness can be tolerated. For example, in many electrical devices the thickness uniformity of e.g. oxide layers or metallization layers is relatively uncritical as long as it meets a threshold thickness sufficient to result in dielectric or conducting properties. In many optical devices, by contrast, the optical thickness of the coating, and the optical thickness uniformity of the coating, is critical to device performance. This is especially true for high power and DFB lasers where small changes in optical thickness (<10%) can lead to significant changes in device performance. In addition, for laser devices in which the passivating coating must cover the surfaces of the device that are susceptible to ambient induced degradation, like those described above, the passivating films must be resistant to ambient contaminants.

Typically in the prior art such coatings are produced by sputtering, evaporation, CVD, or MBE. The latter two processes are known to produce excellent step coverage when sufficient energy is available for redistribution of deposited species, but are still incapable of covering severe features with the uniformity required for many optical devices. This is especially true for deposition processes that operate at <300° C. It would be desirable to have a coating technique capable of step coverage of severe features with coverage or uniformity near 100%. In addition, it would be desirable to have a coating technique that is sufficiently resistant to ambient contaminants to allow lasers, even high performance lasers, to be packaged in non-hermetic packages.

SUMMARY OF THE INVENTION

We have discovered a technique for coating laser devices which results in physical thickness and refractive index control that are not obtainable with thin film techniques conventionally used in this art. It utilizes an atomic layer deposition process to apply laser facet passivation coatings. We use this process to deposit critical optical coatings at relatively low temperatures, thereby reducing the potential for damaging the active portions of the device and for outgassing impurities from the interior parts of the coating apparatus during processing. We have succeeded in producing coatings with nearly 100% uniformity as evidenced by the optical properties of lasers passivated with these films. These coatings provide excellent passivation for laser devices and assemblies that have severe surface topologies as evidenced by the long term stability of lasers passivated with these films in hot, humid ambients (65° C., 65% RH). Finally, because of all the properties discussed above ( i.e. excellent step coverage over extremely severe topologies, low temperature deposition, environmentally stable films), the technique of this invention offers the additional benefit of producing edge emitting lasers, including facet coatings, in a full wafer process. With completed devices still in wafer form, devices can also be tested at the wafer level. Such a wafer scale process has not been achieved to date.

DETAILED DESCRIPTION

Figure 1:
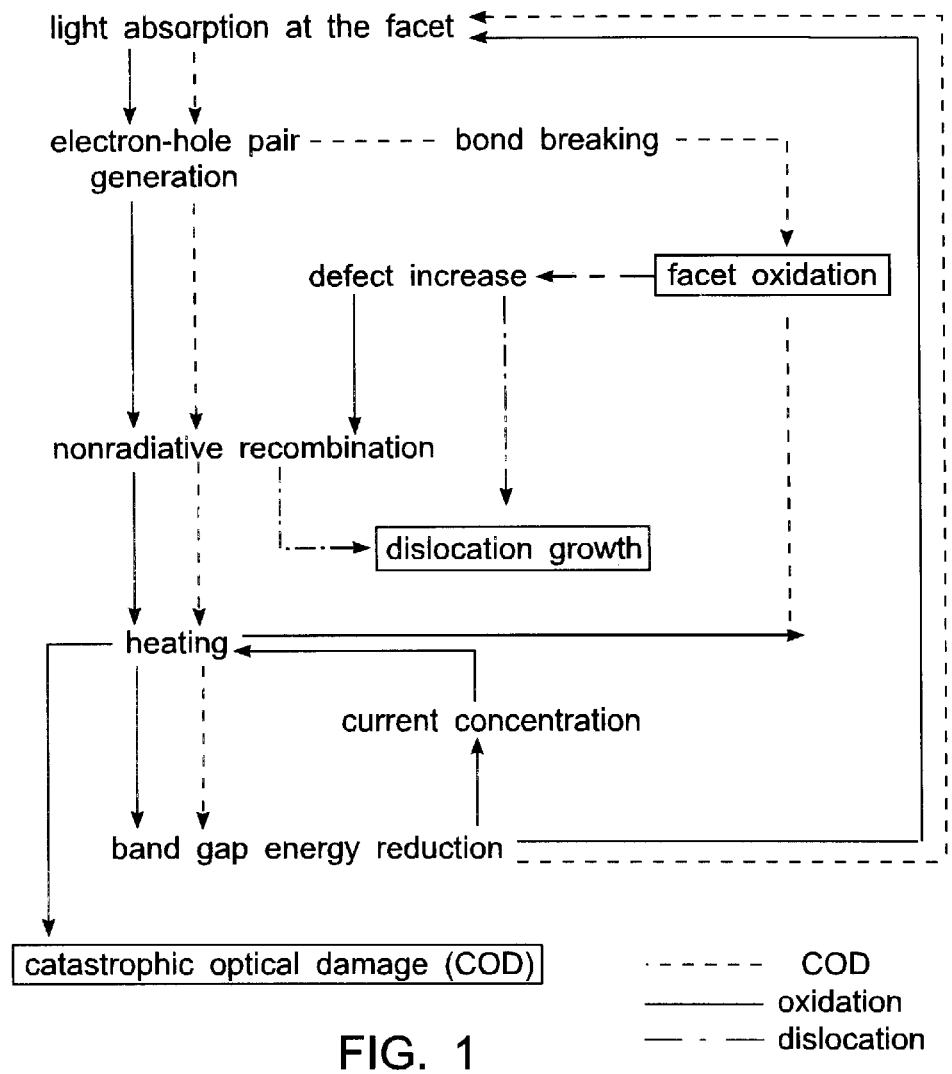
FIG. 1 is a schematic diagram of facet degradation process due to carrier recombination.

Referring to FIG. 1, the degradation process of a typical laser facet is shown schematically. The facet of a laser usually has a large number of surface states due to facet oxidation or contamination when facets are formed in air. These states play a major role in the catastrophic optical damage (COD) mechanism. The maximum output optical power and the long term stability to and reliability can be limited by the COD.

Figure 2:
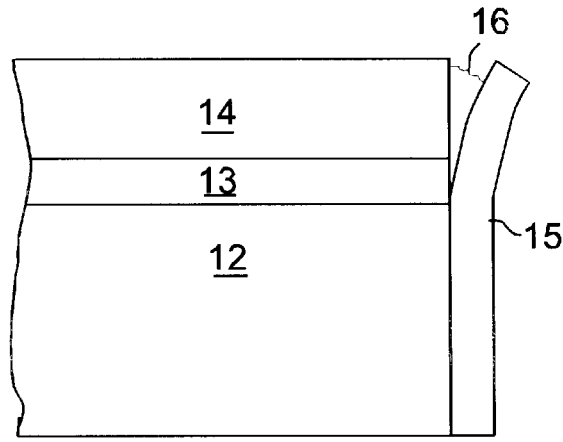
FIG. 2 is a schematic diagram of facet degradation due to moisture induced oxidation/reduction reactions in and around the facet.

Referring to FIG. 2, the degradation process of a typical laser due to oxidation/reduction reactions is shown schematically. For illustration the laser is shown with three semiconductor layers 12, 13 and 14. Layer 12 represents an n⁻substrate, layer 13 the active layer, and layer 14 the p⁺contact region. The facet coating is shown at 15. The semiconductor near the edge of the facet coating oxidizes, as shown at 16, when exposed to moisture in the use environment. Since the oxidized semiconductor has a larger volume than the non-oxidized semiconductor, this imposes stress on the facet coating. In addition, if the facet coating is not moisture impermeable, it will absorb moisture. This leads to a volume increase in the coating that adds to the stress on the facet coating. When the combined stresses exceed the interfacial bond strength between the facet and the semiconductor layers, the facet coating will delaminate to relax the stress. The semiconductor that was previously protected from oxidation then oxidizes. In FIG. 2 the delamination is shown to have proceeded to the point of separating the facet from the active region 13, at which point severe degradation or failure occurs. This process plays a major role in the degradation of the laser in a moist environment.

Figure 3:
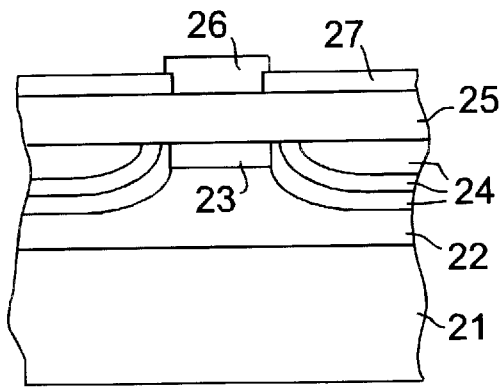
FIG. 3 is a schematic representation of a typical semiconductor multilayer laser structure which is suitable for the passivation process of the invention.

Laser devices to which this invention is primarily directed are semiconductor lasers involving Compounds comprising In, Ga, Al, P, As, which are fabricated on GaAs or InP wafers by known techniques. A schematic cross-section of a typical multilayer laser structure is shown in FIG. 3. An n-type InP substrate is shown at 21 with an n-type buffer layer at 22, an InGaAsP/InGaAs quantum well active layer 23, an InP based p-n-p blocking layer 24, an InP p-type contact layer 25, a metallization contact 26, of e.g. TiPtAu, and an $SiO_2$ insulating layer 27.

Figure 4:
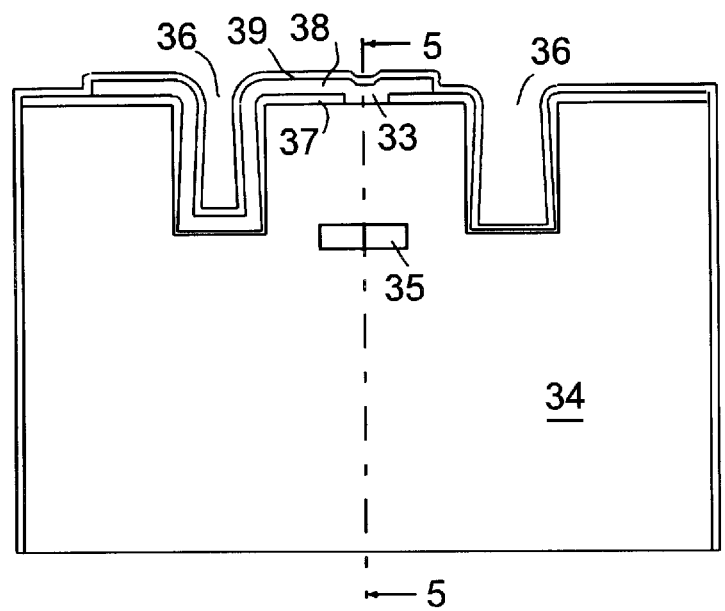
FIG. 4 is a schematic view of a laser showing a passivation layer covering severe features of the kind to which the invention is particularly directed.

The laser devices actually used to demonstrate the invention are trench isolated using the structure shown in FIG. 4. As is evident the surface topography in these devices has severe features. The device shown is a single laser but the same isolation approach can be used for laser arrays.

In FIG. 4 the substrate 34 is shown with active laser region 35 and contact window 33. The active region is isolated in this structure by isolation trenches 36. An $SiO_2$ layer 37 covers the top surface of the structure except for the window 33. A metallization layer 38 is deposited over a portion of the $SiO_2$ layer to contact the semiconductor laser at contact window 33. The conformal passivating layer according to the invention is shown at 39. The width of the device shown in FIG. 4 is approximately 300 $\mu$m, and the height of the device is approximately 100 $\mu$m. The trenches 36 are typically 5–15 $\mu$m deep and 15–30 $\mu$m wide, and have aspect ratios (depth to width) of 2 or greater. The $SiO_2$ layer is typically 0.2–1.0 $\mu$m, and the metallization layer 38 is typically 0.5–10 $\mu$m. The conformal layer 39 is advantageously in the range 0.1 to 0.6 $\mu$m.

It should be understood that the drawings in this description are not to scale and the layer thicknesses, substrate size, and other features are sized for convenience in illustration.

Figure 5:
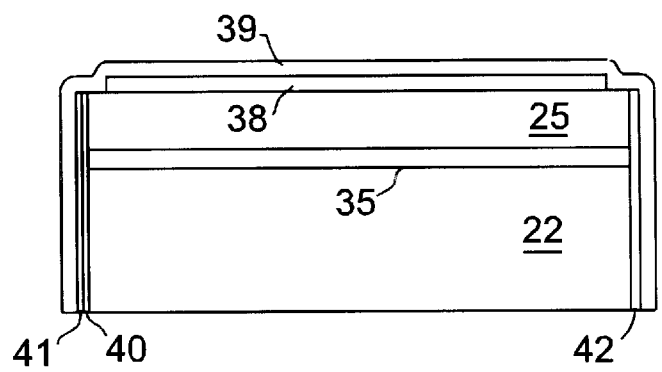
FIG. 5 is a section through 5—5 of FIG. 4.

FIG. 5 shows a cross section through 5—5 of FIG. 4. A quarter wave thick layer 40 of yttrium stabilized zirconia (YSZ), and a quarter wave layer 41 of amorphous silicon are combined to yield the high reflecting (HR) coatings, and a half wave layer 42 of YSZ is the low reflection (LR) coating. The passivating coating according to the invention is shown at 39. The materials described are given by way of example, and many other materials known to those skilled in the art may be used.

According to a preferred aspect of the invention, the laser device is incorporated into a laser package and thereafter the final passivating layer, shown at 39 in the figures, is applied. The laser package comprises the mounting means for the laser, the electrical leads for the laser, and other components e.g. photodiodes, modulators, etc. The entire assembly is then placed in the deposition apparatus and all of the elements of the package are coated with the conformal layer of the invention. Although the preferred aspect of the invention involves a packaged laser those skilled in the art will recognized that this technique can also be used at other stages in the manufacturing process.

Figure 6:
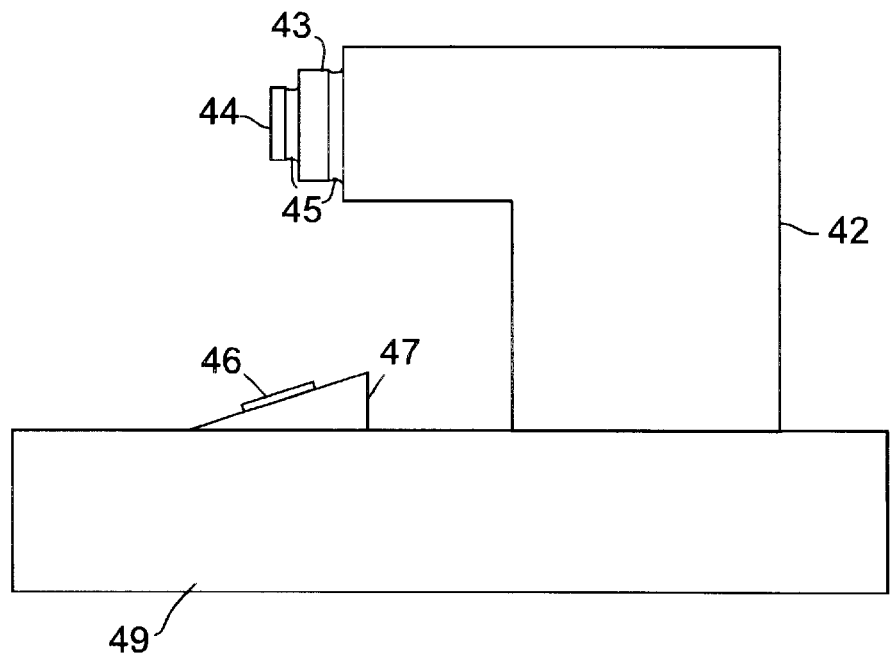
FIG. 6 is a side view of an optical device assembly used to demonstrate the principles of the invention.
Figure 7:
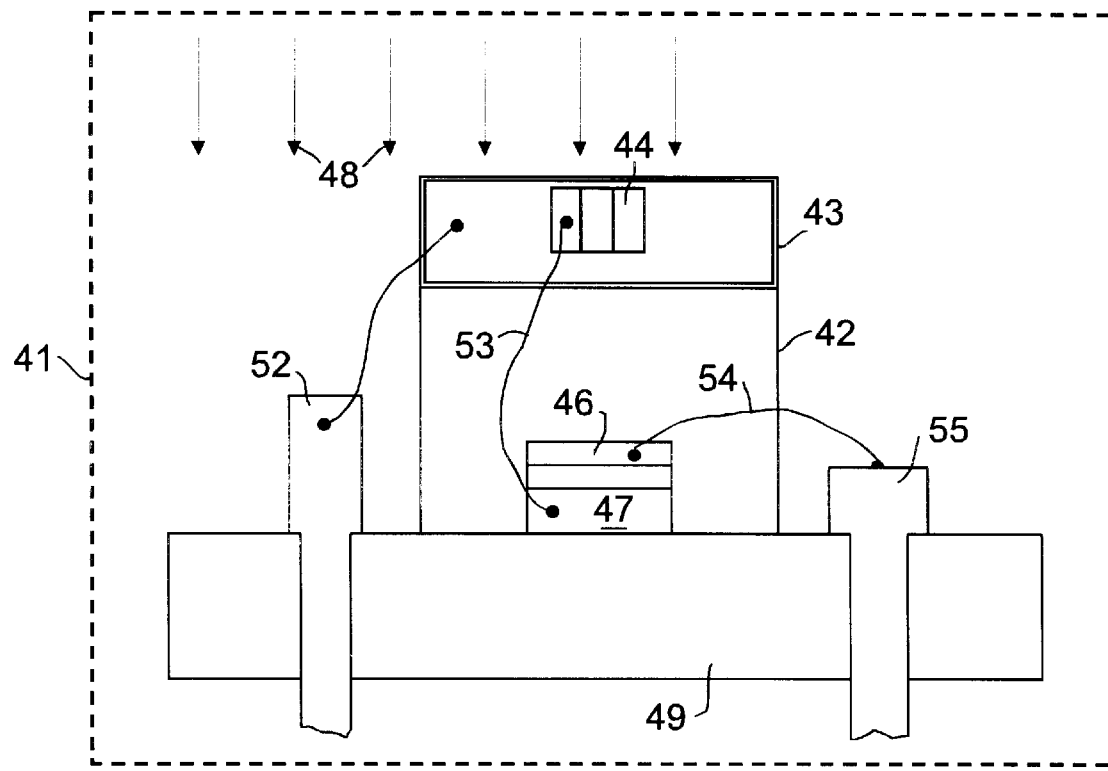
FIG. 7 is a front view of the assembly of FIG. 6, with a typical processing apparatus schematically represented.

A typical low cost laser package is shown in FIGS. 6 and 7. FIG. 6 is a side view of the package, and shows the laser device at 44 mounted on a Si submount 43 and attached to a copper stud 42. Solder 45 is used to mount these elements. A backface photodiode monitor is shown at 46 on submount 47. The photodiode is positioned to monitor light from the backface of laser 44 when the finished laser is in service. The copper stud 42 and the photodiode submount 47 are attached to a header 49. The laser device is approximately 100 $\mu$m thick, 250 $\mu$m long and 300 $\mu$m wide, the Si submount is approximately 700 $\mu$m thick 1000 $\mu$m long and 700 $\mu$m wide, and the copper stud is approximately 500 $\mu$m thick at the mounting end and 1500 $\mu$m thick overall. The distance from the top of the copper stud to the photodiode is approximately 3000 $\mu$m. The two angles of the solder 45 to the laser and the Si submount are between 30 and 50 degrees. A similar angle is found for the solder joint to the copper stud.

The front view of the laser package of FIG. 6 is shown in FIG. 7. Here the electrical connections can be seen which interconnect the laser diode 44 and the backface monitor photodiode 46. The submount 43 for the laser device is shown wire bonded by wire 51 to a pin 52 on the header 49. The laser 44 is connected with wire 53 to the submount 47 for the photodiode 46, and the photodiode is connected by wire 54 to pin 55 of the header.

In applying the conformal passivating layer according to the invention the entire optical device assembly is placed in the process chamber, here represented schematically as 41. The gas reactants are admitted to the vacuum chamber with a flow direction indicated by arrows 48.

The coating process is carried out in a vacuum chamber at a pressure of the order of 1–50 mbar and at a temperature in the range typically of 100° C.–400° C., and preferably 100°–300° C. The primary feature of the process is the formation of the coating by a multiplicity of process cycles in which each cycle produces essentially an equivalent monolayer of the passivating film. As known in the art, a cycle is considered to be all steps required to produce an equivalent monolayer. The number of cycles used depends on the thickness desired but generally exceeds 1000 cycles. In our demonstration we used 4235 cycles forming a coating approximately 385 nm. A typical process is given by way of example as follows.

A laser assembly is loaded into the process chamber and the chamber is heated to a temperature of approximately 150°–200° C. The chamber is purged with nitrogen for a period of several minutes to an hour. We used 1000 seconds for the initial purge. After the chamber is evacuated the gas reactants are introduced. In the specific example described here the passivating film was $Al_2O_3$ and the reactant gases were trimethyl aluminum, $(CH_3)_3Al$, and water. The reactant gases are introduced alternately during each cycle of the process so that in each process cycle an equivalent atomic layer of the aluminum source is deposited on all of the surfaces in the chamber. The aluminum source is then turned off and the system is purged with $N_2$ to flush all non-absorbed $(CH_3)_3Al$ from the reaction chamber. Thereafter the oxidizing agent, in this case water vapor, is introduced to convert the deposited aluminum compound to $Al_2O_3$. This is followed by a $N_2$ purge. For this example, the trimethyl aluminum was introduced at a flow rate of 0.45 $cm^3$/sec. for 6 sec, followed by a nitrogen purge at 0.75 $cm^3$/sec. for 30 sec, and then water vapor at a flow rate of 2.65 $cm^3$/sec. in nitrogen carrier gas for 6 sec, followed by a nitrogen purge at 0.75 $cm^3$/sec. for 6 sec. This procedure is continued for the desired number of cycles. The pressure used in this example was 19.4 mbar. Typically pressures in the range of 10–30 mbar are suitable for these processes. More details of the process and specific processing parameters for alternative materials are given by T. Suntola in "Materials Science Reports, Vol. 4, Number 7, pp. 261–312, December 1989 and U.S. Pat. No. 4,058,430 both of which are incorporated herein by reference.

When conducted in this mode the reaction is complete and precisely stoichiometric. We have found that each part of every surface in every test vehicle is coated at the same time with exactly the same amount of material. Even surfaces that are facing away from the apparent gas flow direction are coated in precisely the same manner as the surfaces exposed directly to the incoming gas stream. Severe features, such as trenches, steps, windows, are covered uniformly. Features with re-entrant angles, such as the sidewalls of the trenches shown in FIG. 4, and the surfaces of the solder joints (45 in FIG. 6), are coated uniformly.

Figure 8:
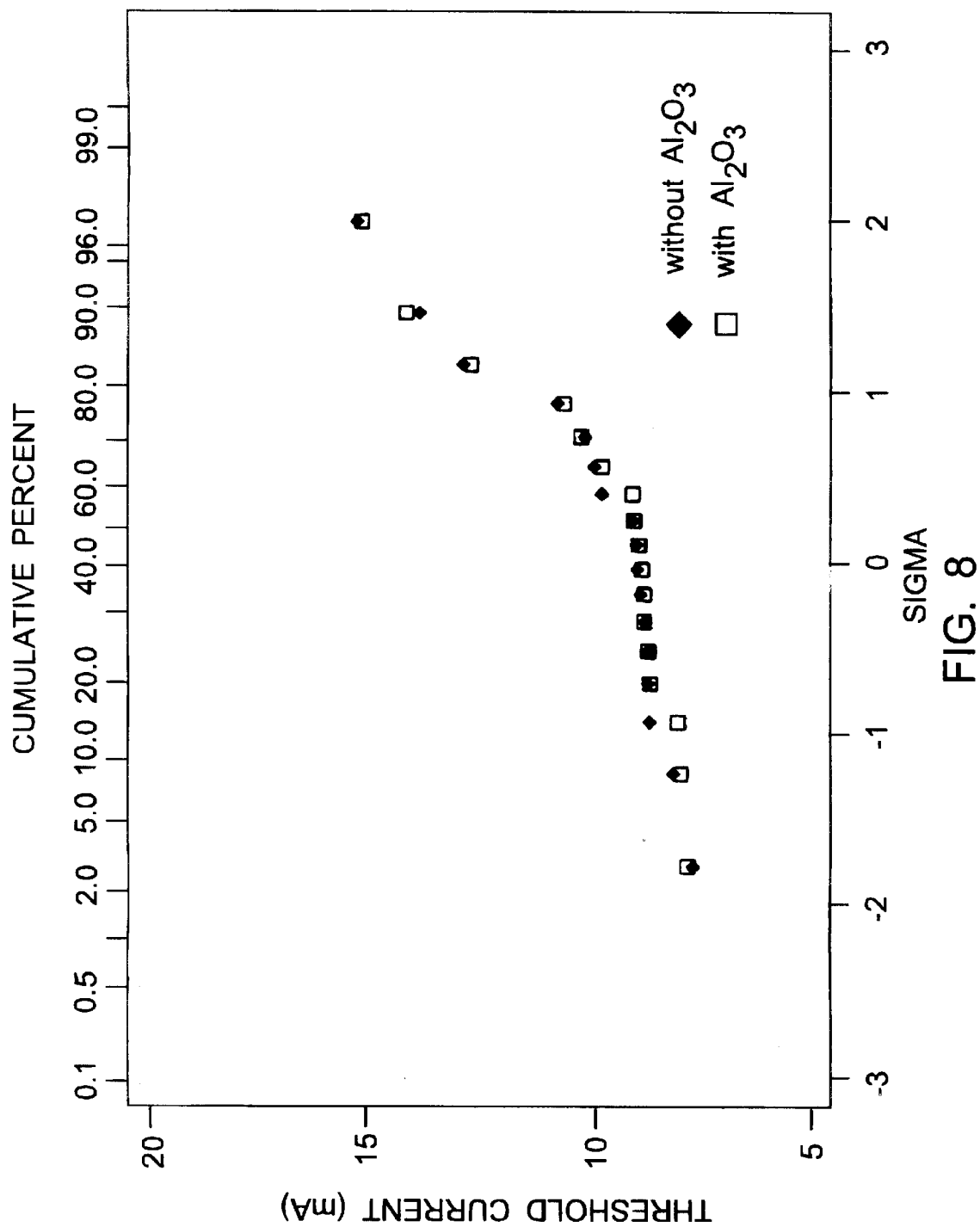
FIG. 8 is a plot of threshold current distribution of lasers schematically shown in FIG. 7 before and after deposition of a passivating film according to the invention.
Figure 9:
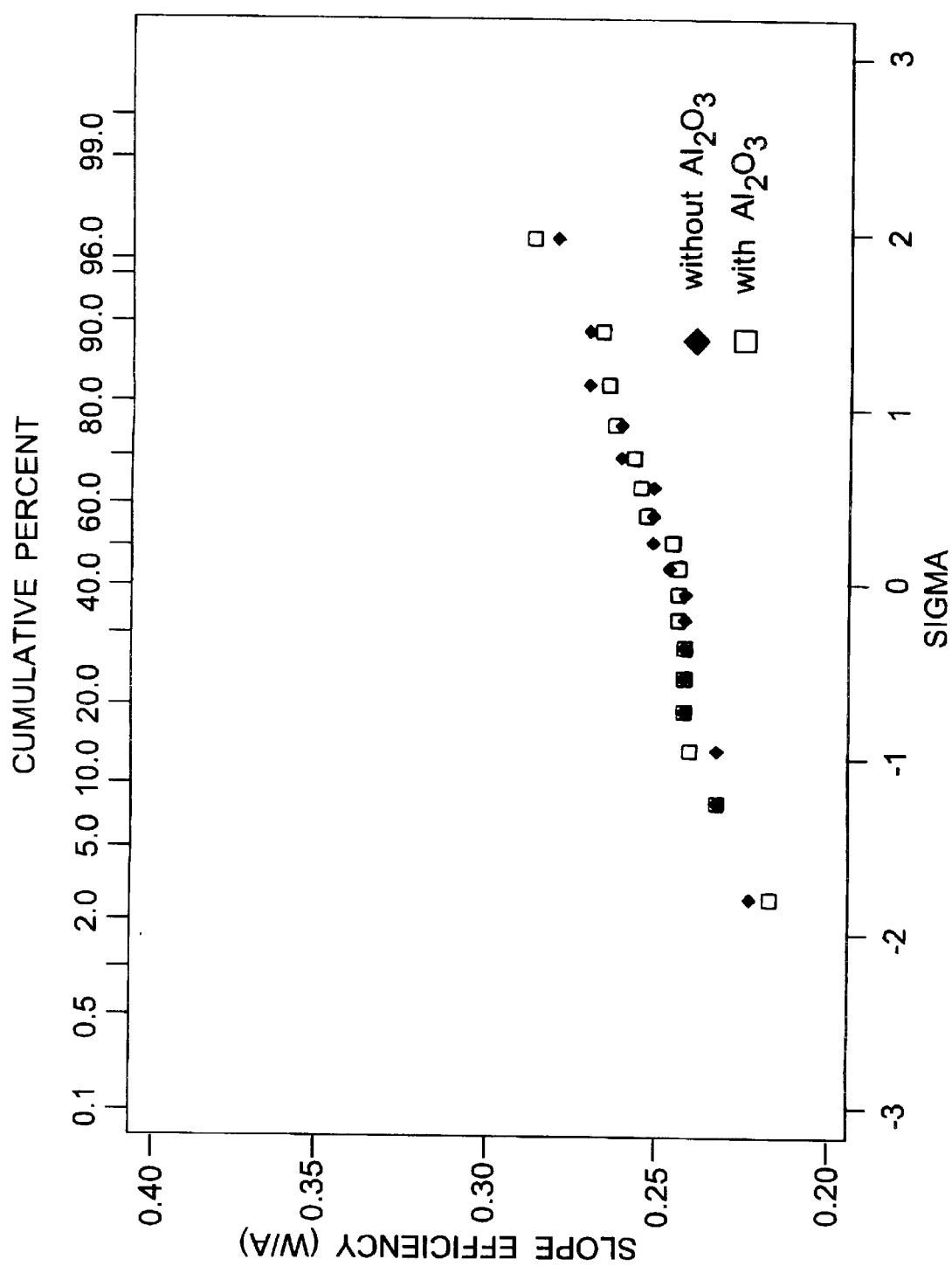
FIG. 9 is a plot of the slope efficiency distribution of lasers similar to those used for the data of FIG. 8.

The precise nature of the optical step coverage (thickness and refractive index) is demonstrated in FIGS. 8 and 9. FIG.

8 is a plot of the normal distribution of the threshold current of the laser structure described above before (solid diamonds) and after (open squares) a half wave thick (approximately 385 nm) $Al_2O_3$ conformal coating was deposited. Similarly, FIG. 9 is a plot of the normal distribution of the slope efficiencies of the lasers used to obtain the threshold current data of FIG. 8, before (solid diamond) and after (open square) a half wave thick $Al_2O_3$ conformal coating was deposited. Note that the threshold current and slope efficiency distribution are not affected by the half wave $Al_2O_3$ film. One would expect, theoretically, to see a measurable shift in both threshold Current and slope efficiency if the optical thickness of the $Al_2O_3$ film on either facet of the laser varied by more than 3%. Thus we conclude that even with this severe topology and the extremely low deposition temperature used to deposit the facet coatings step coverage is exceptional, approaching unity. In fact, using scanning electron microscopy, we observe no detectable thickness variation anywhere within the package.

Because of the precise chemical and physical uniformity of these films, film properties such as refractive index reflect similar uniformity. Accordingly, these techniques are ideal for forming reflecting and antireflecting coatings such as quarter wave and half wave coatings on optical devices such as lasers, amplifiers, modulators, filters, etc.

In the specific example given above the coating material was $Al_2O_3$. A wide variety of coating materials can be used according to the teachings of the invention. For example, we have coated devices and structures with $Ta_2O_5$ using essentially the procedure just described but with $TaCl_5$ and water vapor as the gas reactants. The reaction temperature used in this case was somewhat higher, i.e. approximately 300° C., and the pressure lower, of the order of 3 mbar.

Also insulating layers of $SiO_2$, $TiO_2$ and ZnO can be produced with results similar to those reported here. These materials can also be used as passivating compounds. A wide variety of precursor materials can be chosen. In each case one of the precursor gases is a source of one part of the passivating compound, e.g. $SiCl_4$, $TiCl_4$, and another precursor gas is a source of an oxidizing reactant, e.g. O, S, N, to form the desired passivating compound.

Figure 10:
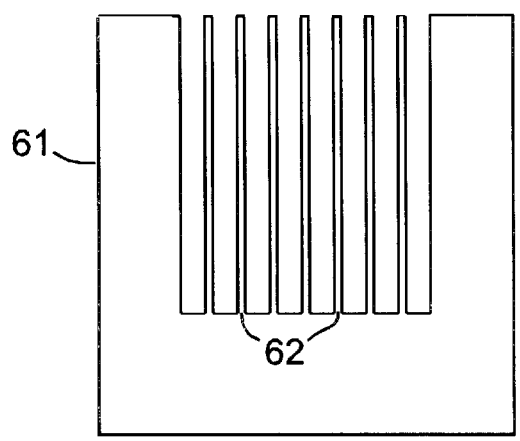
FIG. 10 is a schematic view of a test vehicle used to demonstrate the step coverage capabilities of the technique of the invention.

Although the trenches 36 in FIG. 4 are regarded as severe topological features in the context of the invention, and represent adequately the process goal, we explored the efficacy of the invention for even more severe topological features. Using the test vehicle shown in FIG. 10, the substrate 61 was processed to have a comb-like structure with ridges 62 approximately 500 $\mu$m deep and 10 $\mu$m wide, spaced at 50 $\mu$m, giving a trench aspect ratio of 10. After deposition according to the invention the coating thickness at the bottom of the trenches was the same as the thickness at the top of the trench within measurement error (<1 nm)

Figure 11:
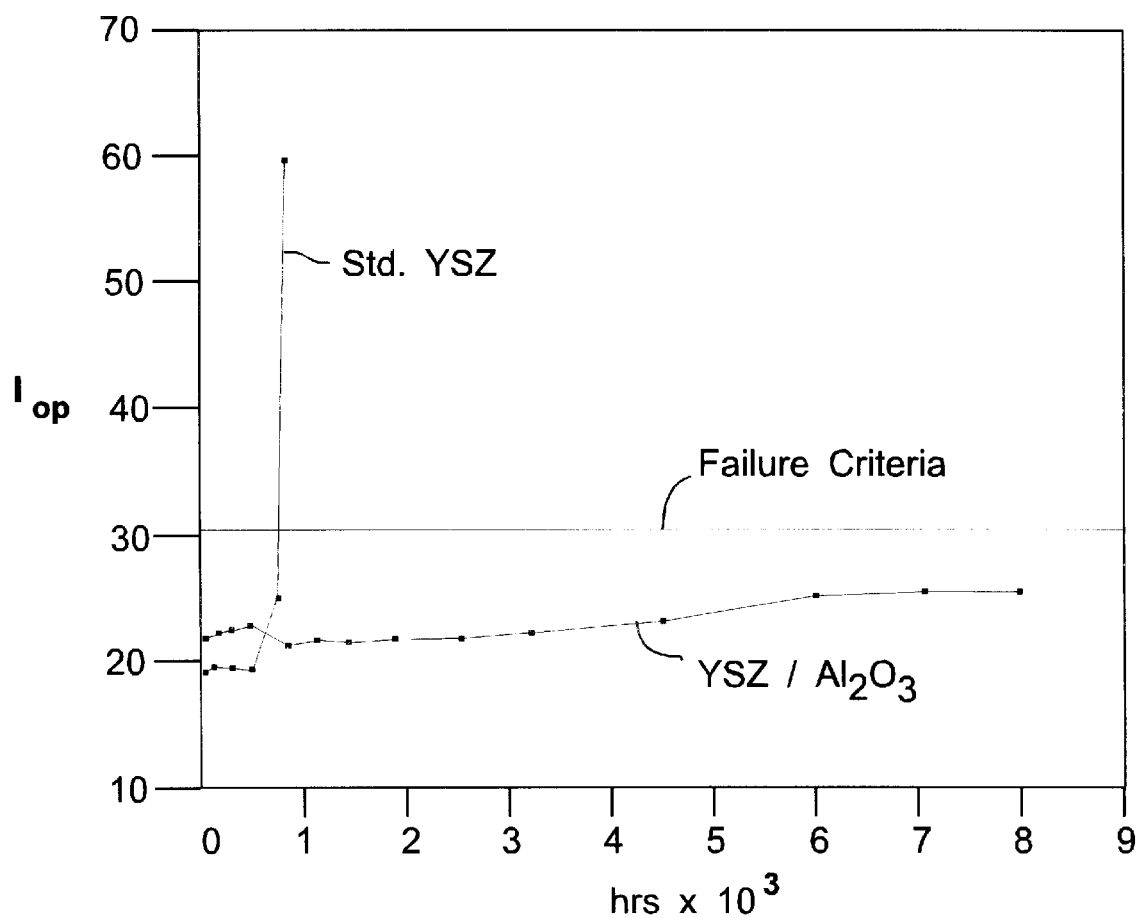
FIG. 11 is a plot of operating current vs. time, comparing conventional lasers and lasers processed according to the invention.

We have also investigated the stability (long term reliability) of laser devices coated with $Al_2O_3$ in hot, humid ambients. The data from one such device is shown in FIG. 11. FIG. 11 is a plot of the current required to maintain a 3 mW output power at 25° C. as a function of time the device is subjected to operation at 85° C./85% RH/30 mA drive. Also shown in the figure is data for a laser device passivated by YSZ using a conventional prior art approach, as well as a curve representing the failure criteria. As shown, the standard YSZ passivated device failed after only 500 hours of operation, whereas the YSZ passivated device coated with an $Al_2O_3$ passivating film according to the invention remains operational even after 8,000 hours. Based on previous data (Osenbach, et al, J. Lightwave Techn., Vol. 15, pg. 1, 1997) a device must survive at least 3000 hours of operation at the conditions of this test to be considered sufficiently reliable for telecommunications applications. We therefore conclude, that the passivation process of this invention provides sufficient protection from moisture so that such lasers can be made reliably, even in non-hermetic packages.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A process for the manufacture of a semiconductor laser comprising the steps of:
   a. forming a layered semiconductor laser structure,
   b. etching said layered semiconductor structure to form a trench along a portion of the layered structure, said trench having a depth at least three times the width, and
   c. coating said etched semiconductor structure with a passivating coating of a passivating compound by the steps of
      i. mounting the etched stacked semiconductor structure in a vacuum chamber,
      ii. evacuating the chamber to a pressure in the range of 1–50 mbar, heating the stacked structure to a temperature in the range 100° C. to 400° C.,
      iii. admitting at least two precursor gases into the chamber in alternate steps, said alternate steps comprising a first step of admitting a flow of a first of said precursor gases, said first of said precursor gases consisting of a source of one part of said passivating compound and a second step of admitting a flow of said second of said precursor gases, said second of said precursor gases comprising a source of an oxidizing agent to form said passivating compound, and continuing to alternate between step one and step two for at least 1000 cycles to produce the desired conformal passivating layer.

2. The process of claim 1 in which the layered semiconductor structure is contained within a semiconductor device package and is coated while contained in the package.

3. A method for the manufacture of an optical device assembly in which the optical device assembly comprises at least one multilayer laser device having a surface topography that includes at least one step feature, said laser device being mounted on a mounting means and additionally including electrical leads for electrically contacting said laser, THE INVENTION CHARACTERIZED BY forming on said optical device assembly a conformal passivating coating by steps comprising:
   a. mounting the optical device assembly in a vacuum chamber,
   b. evacuating the chamber to a pressure in the range of 1–50 mbar,
   c. heating the stacked structure to a temperature in the range 100° C. to 400° C.,
   d. admitting at least two precursor gases into the chamber in alternate steps, said alternate steps comprising a first step of admitting a flow of a first of said precursor gases, said first of said precursor gases consisting of a source of the organometallic precursor of said passivating compound and a second step of admitting a flow of said second of said precursor gases, said second of said precursor gases comprising an oxidizing agent, and continuing to alternate between step one and step two for at least 1000 cycles to produce the desired conformal passivating layer.

4. The method of claim 3 including the additional step of packaging the coated laser device in a non-hermetic package.

5. The method of claim 3 in which the passivating compound is selected from the group consisting of $Al_2O_3$, $SiO_2$, $Ta_2O_5$, $TiO_2$ and ZnO.

6. The method of claim 5 in which the passivating compound is $Al_2O_3$.

7. The method of claim 5 in which the precursor gases include trimethyl aluminum.

8. The method of claim 5 in which the passivating compound is $Ta_2O_5$.

9. The method of claim 8 in which the precursor gases include $TaCl_5$.

10. The method of claim 3 in which the deposition temperature is below 300° C.

11. The method of claim 10 in which the pressure is in the range 10–30 mbar.

12. The method of claim 3 in which the multilayer laser device is part of a semiconductor wafer with a plurality of multilayer devices, and all of said multilayer devices are coated simultaneously with said passivating coating.

13. The method of claim 12 in which the passivating coating has a thickness in the range 0.1–0.6 $\mu$m.

14. The method of claim 3 in which said step is a part of a trench and the trench has an aspect ration of at least 3.

15. The method of claim 3 in which the said step is a part of a re-entrant feature.

16. The method of claim 3 in which the passivating coating has a thickness which varies by less than 10%.

17. The method of claim 16 in which the passivating coating has a thickness that varies by less than 3%.

* * * * *